(12) United States Patent
Meharry et al.

(10) Patent No.: US 8,896,495 B2
(45) Date of Patent: Nov. 25, 2014

(54) METHOD FOR DIRECT CONNECTION OF MMIC AMPLIFIERS TO BALANCED ANTENNA APERTURE

(75) Inventors: David E. Meharry, Lexington, MA (US); David P. Charette, Hudson, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 985 days.

(21) Appl. No.: 12/496,215

(22) Filed: Jul. 1, 2009

(65) Prior Publication Data

US 2011/0001679 A1   Jan. 6, 2011

(51) Int. Cl.
| | |
|---|---|
| *H01Q 9/16* | (2006.01) |
| *H01Q 13/10* | (2006.01) |
| *H01Q 1/50* | (2006.01) |
| *H01L 23/66* | (2006.01) |
| *H01Q 23/00* | (2006.01) |
| *H01Q 13/08* | (2006.01) |

(52) U.S. Cl.
CPC ............... *H01Q 13/08* (2013.01); *H01L 23/66* (2013.01); *H01Q 23/00* (2013.01); *H01L 2223/6677* (2013.01); *H01L 2223/6683* (2013.01); *H01Q 13/10* (2013.01)
USPC ............ 343/865; 343/850; 343/820; 343/767

(58) Field of Classification Search
USPC .......................................... 343/865, 820, 767
See application file for complete search history.

(56) References Cited

U.S. PATENT DOCUMENTS

| | | | | |
|---|---|---|---|---|
| 5,196,805 | A * | 3/1993 | Beckwith et al. ............... | 330/54 |
| 5,264,860 | A * | 11/1993 | Quan ............................ | 343/767 |
| 6,356,240 | B1 * | 3/2002 | Taylor .......................... | 343/767 |
| 2007/0290326 | A1 * | 12/2007 | Yang et al. .................... | 257/697 |

OTHER PUBLICATIONS

J.C. Allen, J. Meloling, Technical Report 1962, Fano Bounds for Compact Antennas, Phase I, Oct. 2007, SSC San Diego.

* cited by examiner

*Primary Examiner* — Graham Smith
(74) *Attorney, Agent, or Firm* — Daniel J. Long

(57) ABSTRACT

A MMIC amplifier is directly connected to the balanced feed points at the aperture of an antenna to eliminate the distance between electronics coupled to the antenna and the antenna itself, such that interfaces, components and connection lines which introduce losses and parasitic effects that degrade system performance are eliminated due the direct connection. Expanding the aperture of the antenna to accommodate the direct connection of a MMIC amplifier to balanced feed points of an antenna has been found to have no deleterious effects on antenna performance. Moreover, when coupling the MMIC amplifier to an unbalanced coaxial line, any associated ripple is minimized due to the direct connection.

5 Claims, 11 Drawing Sheets

METHOD FOR DIRECT CONNECTION OF MMIC AMPLIFIERS TO BALANCED ANTENNA APERTURE

FIELD OF THE INVENTION

This invention relates to antenna structures and more particularly to a method and apparatus for eliminating multiple interfaces, components and connection lines which limit and degrade system performance by placing MMIC amplifier chips or other components at the antenna aperture which provide a balanced output for the balanced feed points of the antenna.

BACKGROUND OF THE INVENTION

Current design methodologies for microwave circuit design of MMIC amplifiers generally include the development of a matching network between the complex impedance of the active devices or transistors and a nominal 50 ohm connection impedance. Likewise, antennas are designed to provide a match between the 377 ohm impedance of free space and 50 ohms.

Often these antennas require a transformation between balanced and unbalanced lines or between coaxial and microstrip transmission lines. Also, note that an antenna element and an amplifier may have a long length transmission line connecting them together. The transmission line and any intermediate elements tend to degrade system performance, with degradation for very broad bandwidth applications being even greater.

In short, connections between an antenna aperture and receiver or transmitter electronics often includes multiple interfaces, components and connection lines, all of which limit and degrade system performance with their respective losses and parasitic effects. If these effects could be eliminated, the result would be a significantly improved system noise figure, output power, linearity, flatness, match, and bandwidth.

More particularly, electronics utilized in connection with an antenna, either transmitter or receiver, were previously located remotely from the antenna itself. Thus, between the electronics and the antenna there was typically a long piece of coaxial cable, connectors attaching the cable to the electronic boxes, and baluns or other devices used to match the nominal 50 ohm coax impedance to the impedance of the antenna at the antenna feed points.

While it is possible to feed an antenna with an unbalanced line, all of the separation between the antenna itself and the associated interfacing electronics adds insertion loss, resulting in lost sensitivity for a receiver and lost transmit power for a transmitter, noting that all the interfaces add up to decrease the bandwidth of operation. If the bandwidth of operation is decreased, this also decreases the ability to match the antenna to associated electronic devices.

As described in a patent application entitled "Integrated Electronics Matching Circuit At Antenna Feed Point For Maintaining Wide Bandwidth And A Low VSWR Operation", invented by David E. Meharry, Edward Urbanik, and Arturs Dinbergs, Ser. No. 12/468,109 filed May 19, 2009 and assigned to the assignee hereof, the contents of which are incorporated herein by reference, to provide a wide bandwidth match, integrated electronics matching circuits are placed at the feed point of the antenna above the ground plane normally utilized in printed circuit microwave antennas. The purpose of the location of the integrated electronics above the integrated circuit ground plane is to reduce to zero the connection length from the feed point to the place where the matching is done. It is noted in this patent application that the conventional length from where the initial or complete matching is done beneath the ground plane up to the antenna feed point could be considerable and sometimes exceeded 100 mils.

While this application was directed primarily to an integrated electronics matching circuit, there is still a necessity to place an amplifier having a balanced output at the feed of the antenna, noting that most antennas are designed to have a balanced input at their feed point.

There is therefore a necessity to provide electronic circuits at the feed point of the antenna which present a balanced interconnection topology. This includes electronics functioning as an amplifier, rather than functioning as a balun or tuning circuit.

Assuming that one can get the electronics close to the feed point of the antenna, another benefit is that if these electronics involve balanced electronics, one can select a more appropriate impedance level for the antenna. If one provides balanced electronics at the feed point, one can obtain a wide bandwidth when going to higher impedances. Thus, while nominally working at a 50 ohm input impedance, providing a balanced interconnect circuit one can provide a 100 ohm output impedance which is useful in improving bandwidth characteristics for the antenna.

There are two common broadband microwave antennas for which the above set of problems is severe. The first is the Vivaldi notch antenna which is a tapered notch. The second is a bi-cone antenna. If a way could be found to provide a balanced amplifier circuit directly coupled to the feed points of these antennas, then it would be possible to eliminate interfaces which limit and degrade system performance.

SUMMARY OF INVENTION

The purpose of the subject invention is to provide amplifiers having a balanced output directly at the feed point of the particular antenna. These amplifiers have either a balanced output or a balanced input and need to be microminiaturized to be able to fit at the antenna aperture. In one embodiment, these amplifiers are made using MMIC fabrication techniques.

For a tapered notch, the invention is implemented in one embodiment by expanding the opening behind the feed point called a lagoon. Splitting the lagoon in half and extending the metal of the lagoon in a tab towards the feed point creates a space where miniature electronics can be mounted in such a way that low parasitic connections can be made to the antenna.

With respect to bi-cone antennas, there is a small area where the points of the two cones nearly touch. Removal of material near this feed area can be exploited to create an area for placing the electronics at the feed point of the bi-cone antenna and thus enable a low parasitic feed to the antenna.

While it was felt that altering the antenna aperture would have significant effects on antenna characteristics and performance, this was found not to be true. This being the case, the subject invention involves altering the antenna aperture to accommodate MMIC components on elements that have balanced characteristics.

With respect to the Vivaldi notch antennas, it has been found that by enlarging the lagoon and by inserting a metal cantilevered diving board-like tab structure to support the electronics within the lagoon there are no deleterious effects on the properties of the antenna. This permits the placing of an amplifier with a balanced output directly at the feed point of the Vivaldi notch antenna, with a negligible VSWR impact from the split lagoon bridge configuration. Thus, with a direct attachment to a balanced amplifier, one can interface to the Vivaldi notch or tapered notch antenna in a parasitic free environment.

With respect to the bi-cone antenna, the challenge is to preserve balanced line symmetry when a MMIC device is placed within the cone boundary. It has also been found that a balanced feed is feasible for bi-cone antennas in which the MMIC balanced amplifier circuitry is located within the cone feed region. It is noted that the feed region is critical to bandwidth performance; and small asymmetries at the feed point were thought to have a major impact on high end performance. This turned out not to be a concern thus allowing the subject topology.

It will be appreciated that introducing unbalanced electronics at the feed of a bi-cone can result in major asymmetries. However, by providing a symmetric feed to the bi-cone at the bi-cone aperture one improves the VSWR bandwidth. In one embodiment, this feed structure at the bi-cone feed points includes providing balanced lines along ceramic remotes, with the MMIC device below the cone tips.

It has been found with the subject technology and the direct attachment of the MMIC chip to the feed points, ripple associated with coaxial feeds is reduced by 3 db. It is also been found that a 2 watt PHEMT power amplifier can be designed to drive the notch directly, whereas as a 20 watt HEMT power amplifier can also be designed to directly drive the notch. Moreover, as to bi-cone antennas, it has been found that a bi-cone having a balanced impedance is well-behaved in that there is a real 125 ohms to ground and a 250 ohm push-pull characteristic at the feed point of the antenna. In either case, what has been found is that when graphing output power versus frequency, for a 50 ohm coaxial feed there is significant ripple, whereas for power out versus frequency for the direct coupling or direct feed there is virtually no ripple, leading to the conclusion that bi-cone antennas that are directly coupled to the amplifiers are well-behaved.

More generally, it has been found for both receive and transmit matching there is an improvement by placing MMIC circuits at the antenna feed regions.

In summary, it has been found that it is possible to directly interconnect to the antenna feed points using the balanced input or output of an amplifier, thus to eliminate degraded system performance associated with non-direct multiple interfaces, components and connections which introduce losses and parasitic effects. For receiving, a balanced input amplifier is directly coupled to the antenna feed points, whereas for transmitters an amplifier having a balanced output is directly coupled to the antenna feed points.

BRIEF DESCRIPTION OF THE DRAWINGS

These and other features of the subject invention will be better understood in connection with the Detailed Description, in conjunction with the Drawings, of which.

DETAILED DESCRIPTION

Figures 1, 1A:
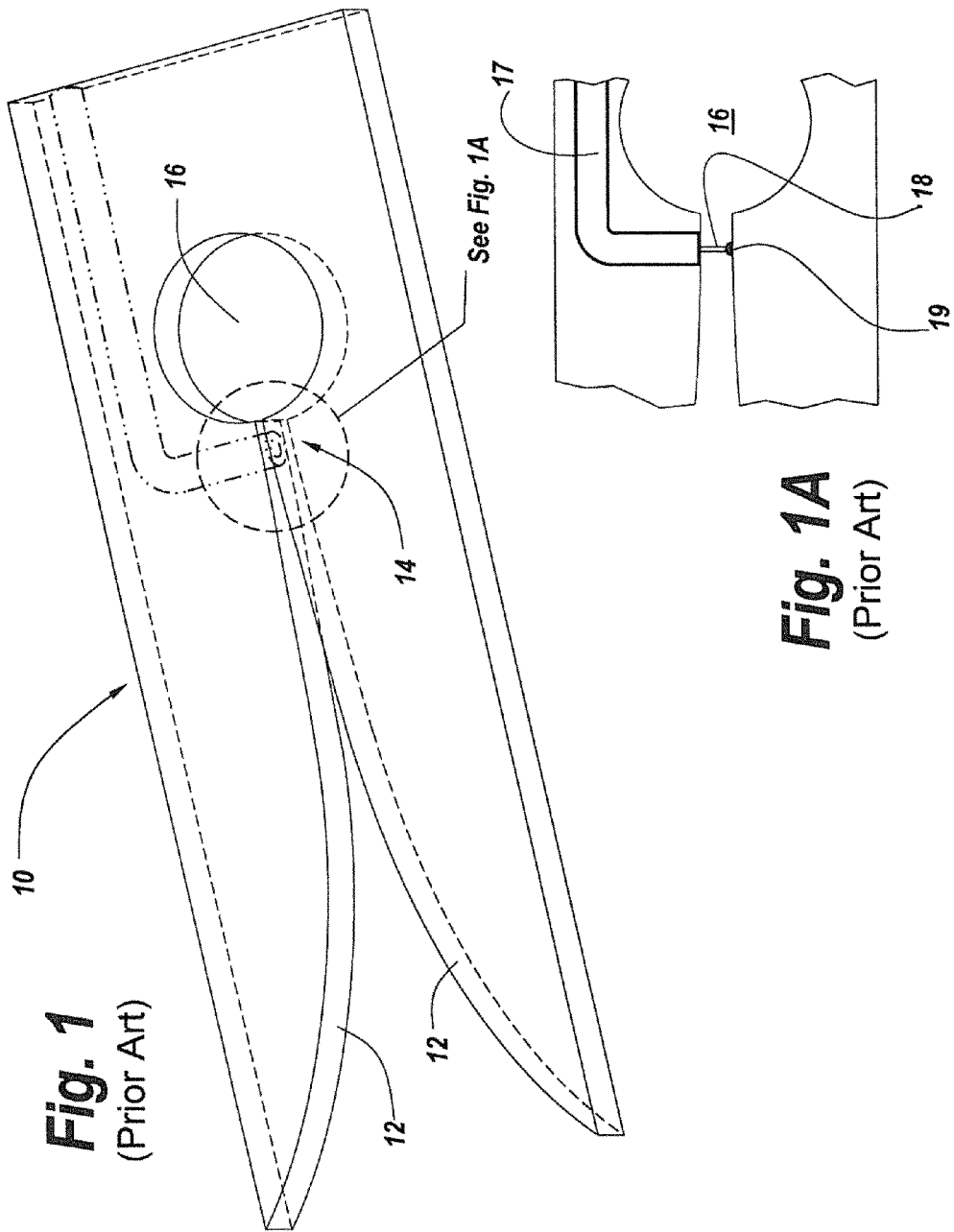
FIG. 1 is a diagrammatic illustration of the prior art feed for a Vivaldi notch antenna illustrating an unbalanced feed to balanced feed points taking place above the lagoon for the Vivaldi Notch.
FIG. 1A is a detail of the conventional feed for the Prior Art Vivaldi notch antenna of FIG. 1.

Referring now to FIG. 1, what is pictured is a traditional Vivaldi notch antenna which is fed by a coaxial line which is by its very nature an unbalanced device. The feed to the Vivaldi notch at the feed points of the antenna present the problem of the impedance mismatch between the balanced feed points of the Vivaldi notch antenna and its unbalanced feed line.

Here it can be seen that Vivaldi notch antenna has tapered flutes 12 which provide the antenna with an extremely wide bandwidth. These flutes are terminated at a feed point region 14 which is bounded by an open circular region 16 referred to as a lagoon. It is the purpose of this lagoon to act as a broadband tuning stub for the antenna.

As seen in FIG. 1A, the unbalanced feed utilizes a coaxial cable 17 having a cable conductor 18 that is topped at 19 to the wall of flute 12 to establish the best impedance match possible. However, this is a non-optimal feeding arrangement.

As mentioned herein, the problems with providing a broadband antenna which naturally has a balanced input with an unbalanced transmission line is that the use of the unbalanced transmission line results in losses due to the fact that the electronics feeding the antenna are spaced from the feed point of the antenna itself. Also, as mentioned herein before, the distance between the transmitter and/or receiver from the antenna and the antenna itself results in degradation of system performance associated with non-direct multiple interfaces components and connections, which introduce losses as well as parasitic effects. All of these are result, at least in part, of the removal of the electronics from the antenna itself.

Moreover, in addition to the above deleterious effects of removing the electronics from the feed point of an antenna is the problem that if one were to have a balanced line at the feed point of the antenna higher efficiency modes would be possible at least at the transmit mode, however with unbalanced lines these higher efficiencies are not achievable.

The problem then becomes how to directly connect balanced electronics to the feed point of such a Vivaldi notch antenna, or in fact any broadband antenna which is characterized by balanced feed points.

While MMIC technology permits the microminiaturization of the electronics to the point that it could be potentially placed at the point of an antenna, the question is where can one provide room for the placement of these microminiaturized components.

Figure 2:
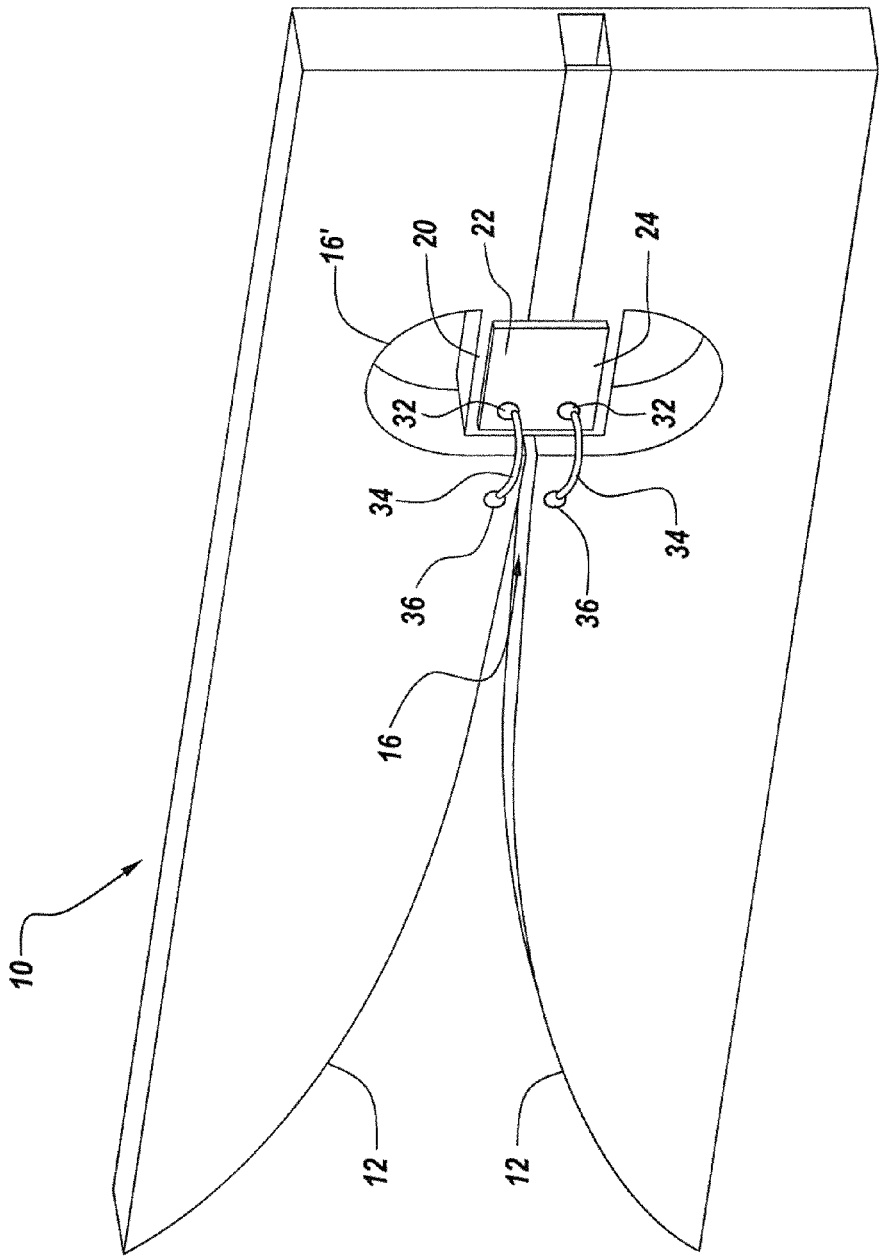
FIG. 2 is a diagrammatic illustration of the subject expanded lagoon to permit the placement of balanced electronics at the feed of the Vivaldi notch antenna, with the electronics being mounted to an extension from the rear portion of the lagoon towards the feed of the Vivaldi Notch.

Referring to FIG. 2, the Vivaldi notch antenna of FIG. 1 is provided with an expanded lagoon 16' and a support surface 20 which extends from the back 22 of lagoon 16' forward towards the feed points 14 of the Vivaldi notch antenna. This support is electrically conductive and may be integral to the portion of the Vivaldi notch antenna into which the lagoon is formed. In one application this support is a cantilevered support from the back of the lagoon which is conductive and onto which a MMIC device 24 having a balanced input or output is mounted. The availability of such a support within the expanded region of the lagoon permits a direct connection of the balanced electronics to the balanced feed point.

By providing the electronics directly at the feed point of the antenna and having ascertained that there are no deleterious effects to modifying the lagoon in this manner, it is now possible to provide the wideband Vivaldi notch antenna with a mechanism to remove the losses that are associated with all the components that are necessary to connect a transmitter or receiver to the feed point of the antenna. Moreover, the direct feeding of the Vivaldi Notch feed points with a balanced circuit eliminates parasitics associated with the long connection between the electronics and the feed point referred to above and the parasitics associated with the unbalanced feed. Moreover, the ability to place the unbalanced electronics at the feed of the Vivaldi notch antenna enables higher dynamic range in the receive mode and the aforementioned higher efficiency modes in the transmit mode. Most importantly, the modifications described above to the Vivaldi notch antenna do not degrade the bandwidth of the antenna or in fact any of its other operating characteristics.

Figure 3:
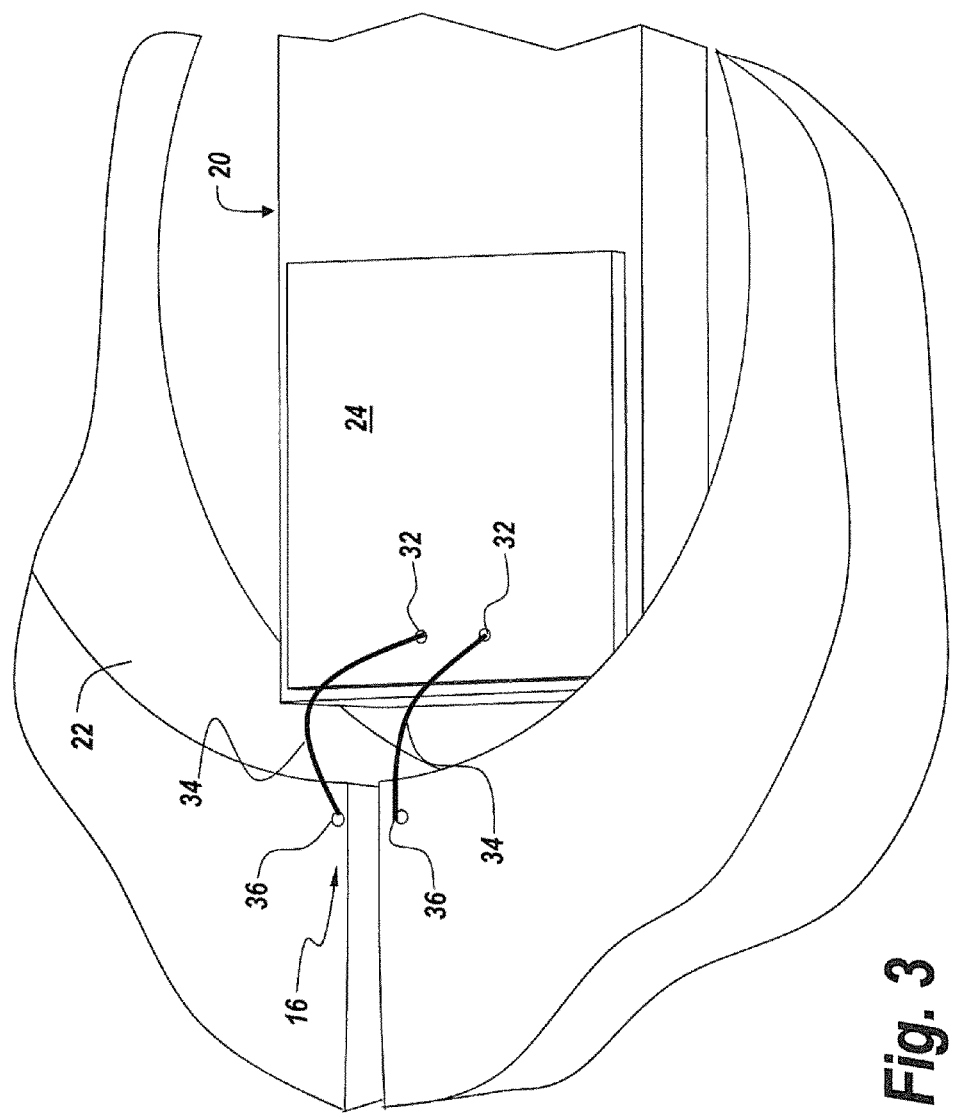
FIG. 3 is a diagrammatic illustration of the MMIC electronic circuitry mounted on the projection of FIG. 2 showing the balanced feeds from the balanced MMIC circuit to the balanced feed points of the Vivaldi notch antenna.

Referring now to FIG. 3, what is shown is an expanded view of support 20 and the MMIC package 24 showing a balanced MMIC circuit 30 having contact pads 32 which comprise the balanced output or input to the device. Contact pads 32 are in turn coupled by leads 34 directly to the feed points 36 of antenna feed 16. Thus, as can be seen leads 34 provide a direct connection of contact pads 32 to the balanced feed points 36 of the antenna.

Figure 4:
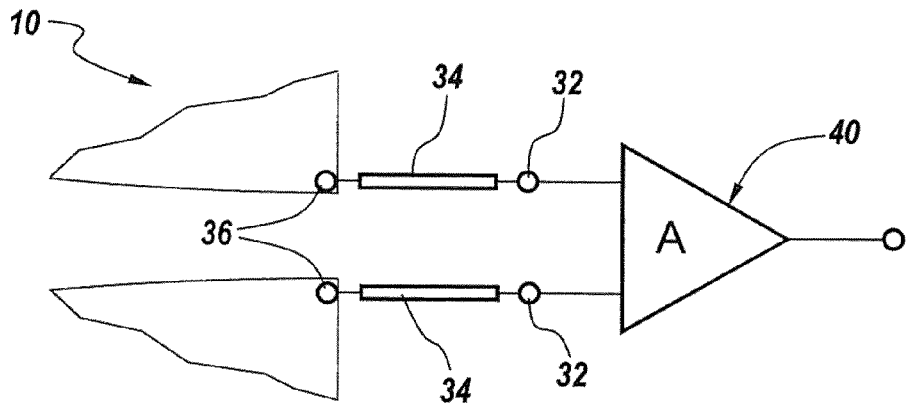
FIG. 4 is a schematic illustration of the use of a differential amplifier having either balanced inputs or outputs coupled directly to the balanced feed points of the Vivaldi notch antenna FIG. 1.

From a conceptual point of view and referring now to FIG. 4, feed points 36 of the Vivaldi notch antenna 10 are shown as coupled to contact points 32 of the balanced electronics 30, here shown by differential balanced output device 40. Here leads 34 provide an exceedingly short connection path between outputs 22 of device 40 and feed points 36 of the Vivaldi notch antenna.

Figure 5:
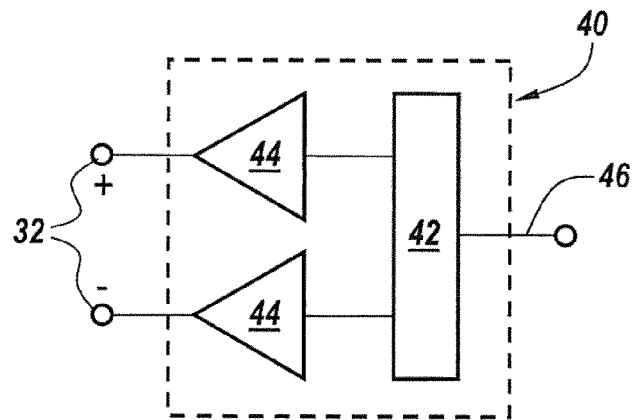
FIG. 5 is a diagrammatic illustration of the amplifier FIG. 4 in a transmit mode in which a balun is coupled to an unbalanced coaxial lead, the output of which are coupled to respective amplifiers to provide the balanced output to be directly coupled to the Vivaldi notch antenna.

Referring to FIG. 5, the balanced circuit device 40 of FIG. 4 in a transmit mode may include a balun 42 having its output coupled to single-ended amplifiers 44 which are in turn coupled to contact pads 32. Balun 42 is fed by an unbalanced coaxial line 46 as illustrated.

Figure 6:
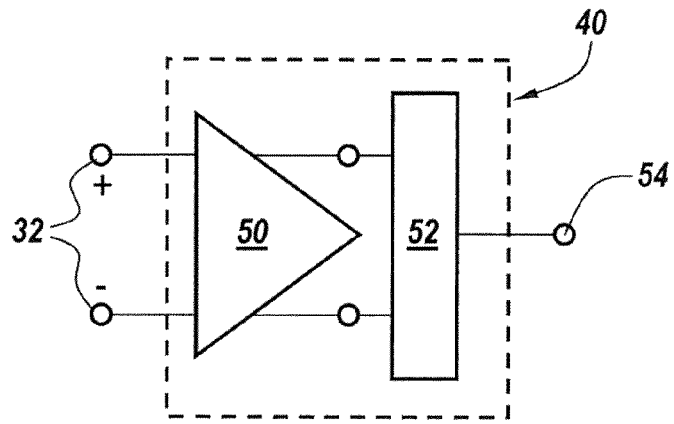
FIG. 6 is a diagrammatic illustration of the amplifier FIG. 4 for a receive mode in which a true differential amplifier is directly coupled to the balanced feed points of the Vivaldi notch antenna of FIG. 1, with a balun utilized to convert the balanced outputs of the differential amplifier to an unbalanced output for connection to coaxial cable.

Referring to FIG. 6, balanced circuit 40 in the receive mode may be provided with a true differential amplifier 50 having its inputs connected to contact pads 32, with the output of differential amplifier being a balanced output coupled to balun 52 which converts the balanced output of the differential amplifier 50 to an unbalanced output at 54 to which a suitable coaxial cable may be attached.

Figure 7:
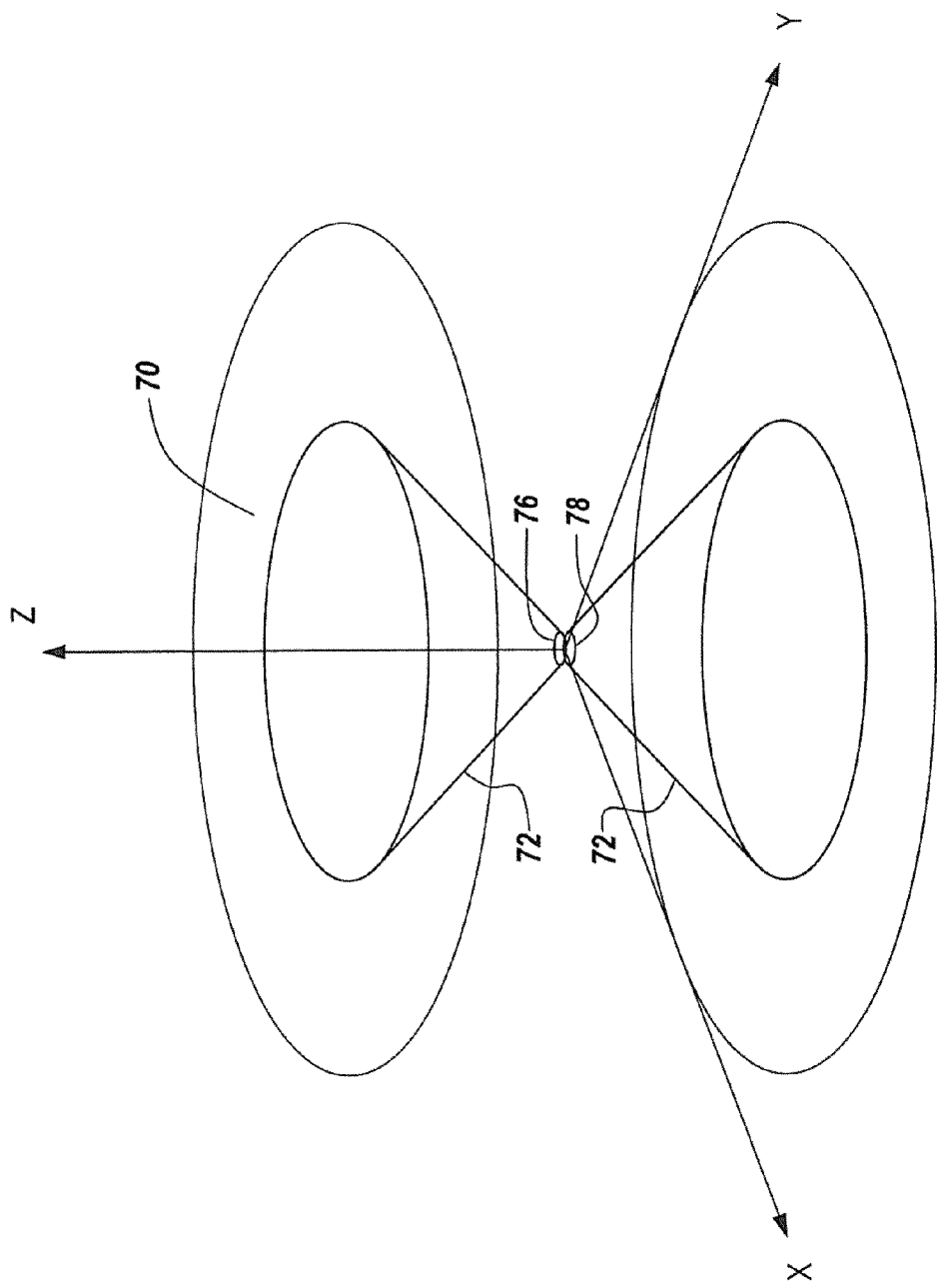
FIG. 7 is a diagrammatic illustration of a traditional bi-cone antenna in which the feed point of the bi-cone is at the opposed apices of the opposed cones.

Having described the benefit of locating microelectronics at the feed point of a Vivaldi notch antenna, another type of antenna which is a broadband microwave antenna that is popular is the so called bi-cone antenna here shown in FIG. 7 at 70. The bi-cone antenna in one embodiment includes opposed cones 72 and 74 which have opposed apices 76 and 78 as illustrated.

It is a property of these bi-cone antennas, whether they are solid cones or have conical surfaces, that the feed point is characterized as being balanced.

These bi-cone antennas are typically fed at the opposed juncture of the apices of the opposed cones utilizing an unbalanced feed such as provided with coaxial cable. The same problems that are associated with the unbalanced coax feed of the Vivaldi notch also apply to the bi-cone antennas.

Figure 8:
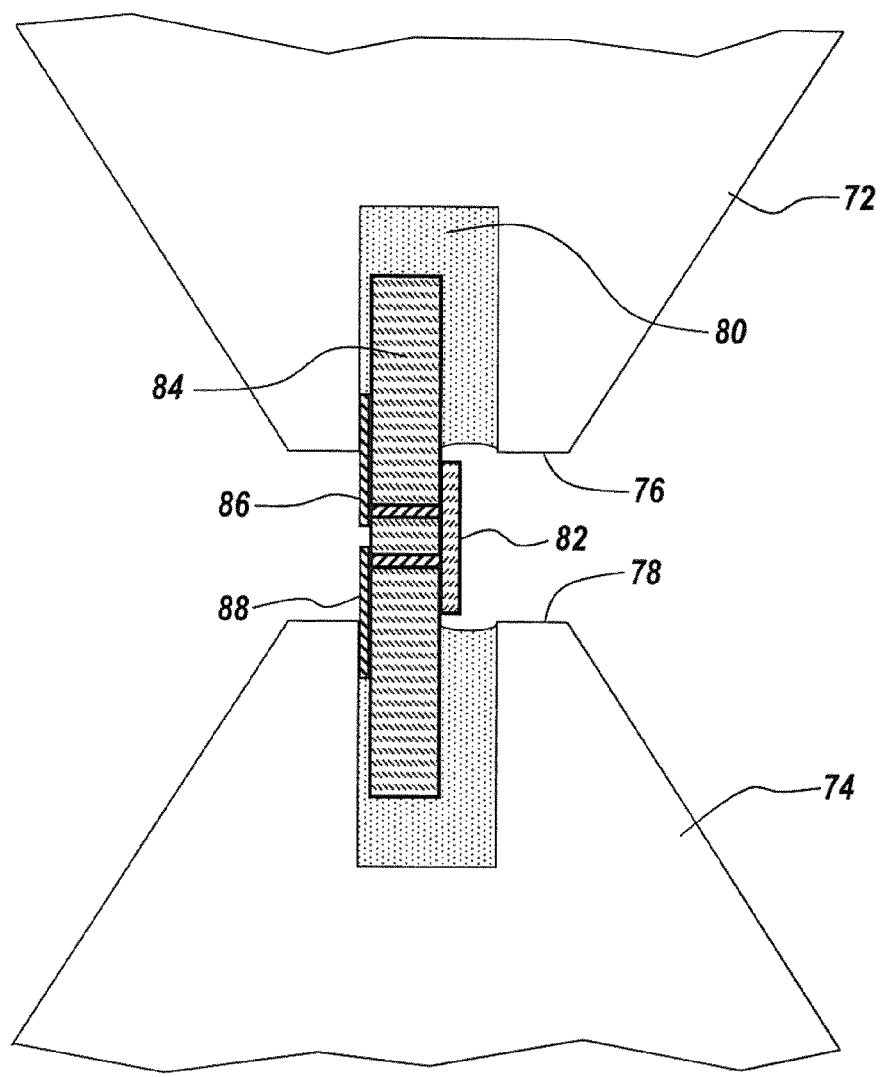
FIG. 8 is a diagrammatic illustration of the provision of a channel in the opposed apices of the bi-cone antenna of FIG. 7 at which is a disposed balanced MMIC circuit mounded to a ceramic substrate with the balanced output of the circuit coupled to contact metallization that runs to the balanced feed points of the bi-cone.

Referring to FIG. 8, it has been found that the apices 76 and 78 of bi-cones 72 and 74 may be notched out as illustrated at 80 so as to be able to accommodate a micro-electronics package 82 within the notch or at least between the opposed apices.

As mentioned herein, providing notch 80 and for instance a substrate 84 carrying the micro-electronics package 82 with metallizations 86 and 88 to connect the balanced electronics 82 to opposed apices does not deleteriously affect either the VSWR or any of the other characteristics of the bi-cone antenna. It is this finding of the non-interference of the direct positioning of the microelectronics and support within notches of cones 72 and 74, that permits the direct coupling of a balanced circuit to the balanced feed of the antenna.

Figure 9:
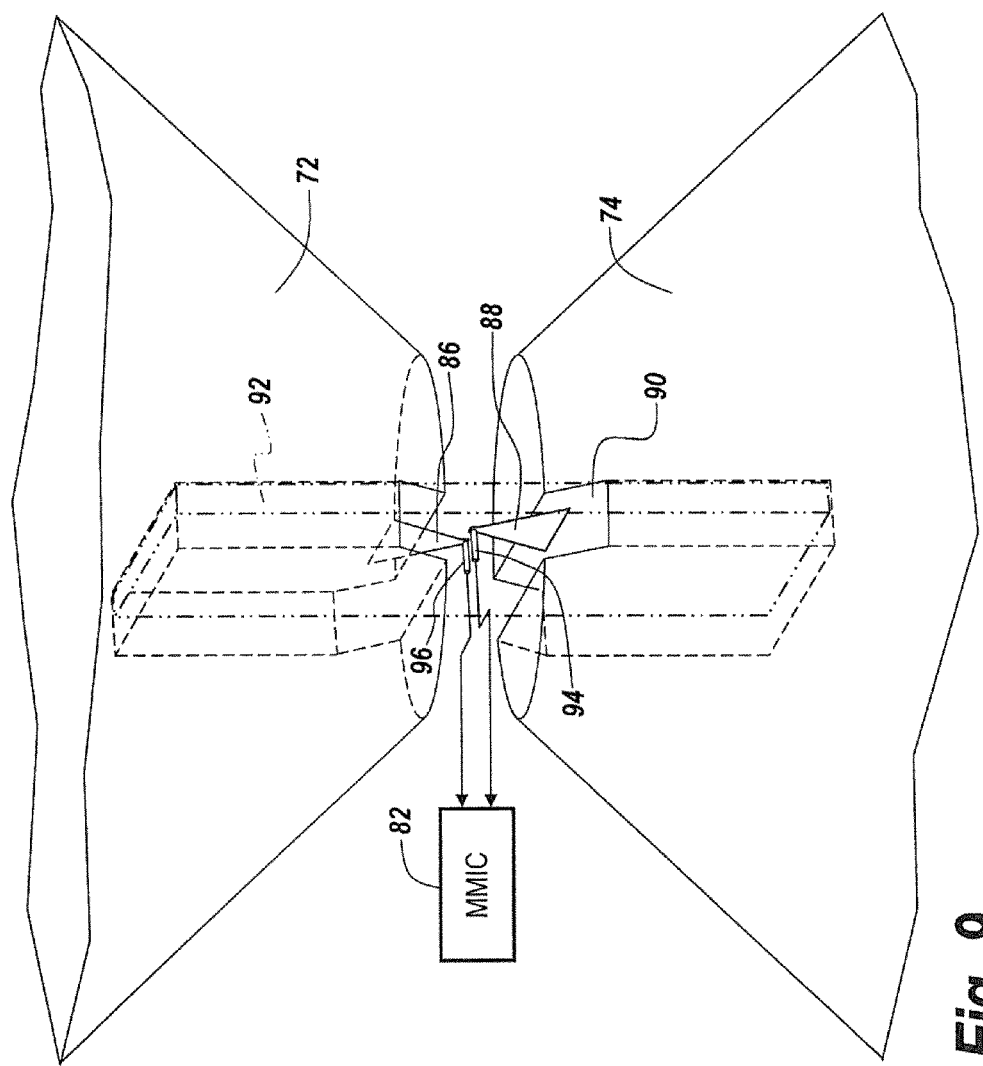
FIG. 9 is a diagrammatic illustration of the placement of the contact metallization for the bi-cones illustrating a triangular shaped metallization having bases in contact with interior channels of the notched bi-cone apices and with the apices of the contact metallization connected to the balanced circuit in the form of a MMIC.

Referring now to FIG. 9, it can be seen that the metallization layers 86 and 88 may be soldered to or adhered to walls 90 and 92 of notch 80, with vias 94 and 96 through the ceramic substrate to micro-electronics 82 conveniently providing the balanced circuit 82 with direct connection to the balanced feed points of the bi-cone antenna.

Figure 10:
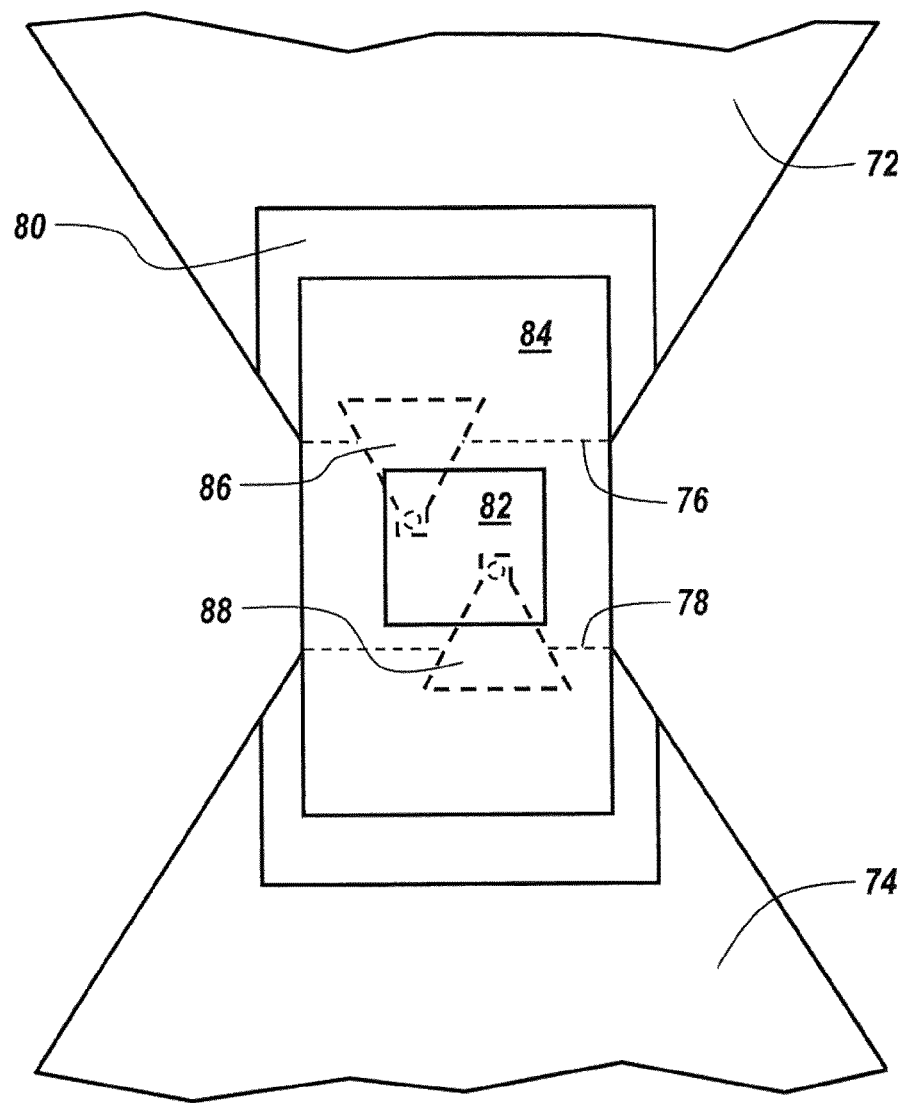
FIG. 10 is a diagrammatic illustration of the placement of the contact metallization for the bi-cones on the surface of the ceramic substrate of FIG. 8 showing the ceramic substrate within the notch within the apices of the bi-cones.

Referring to FIG. 10, as can be seen the ceramic substrate 84 is patterned with contact metallizations 86 and 88, with the ceramic substrate residing within notch 80 shown in dotted outline.

Figure 11:
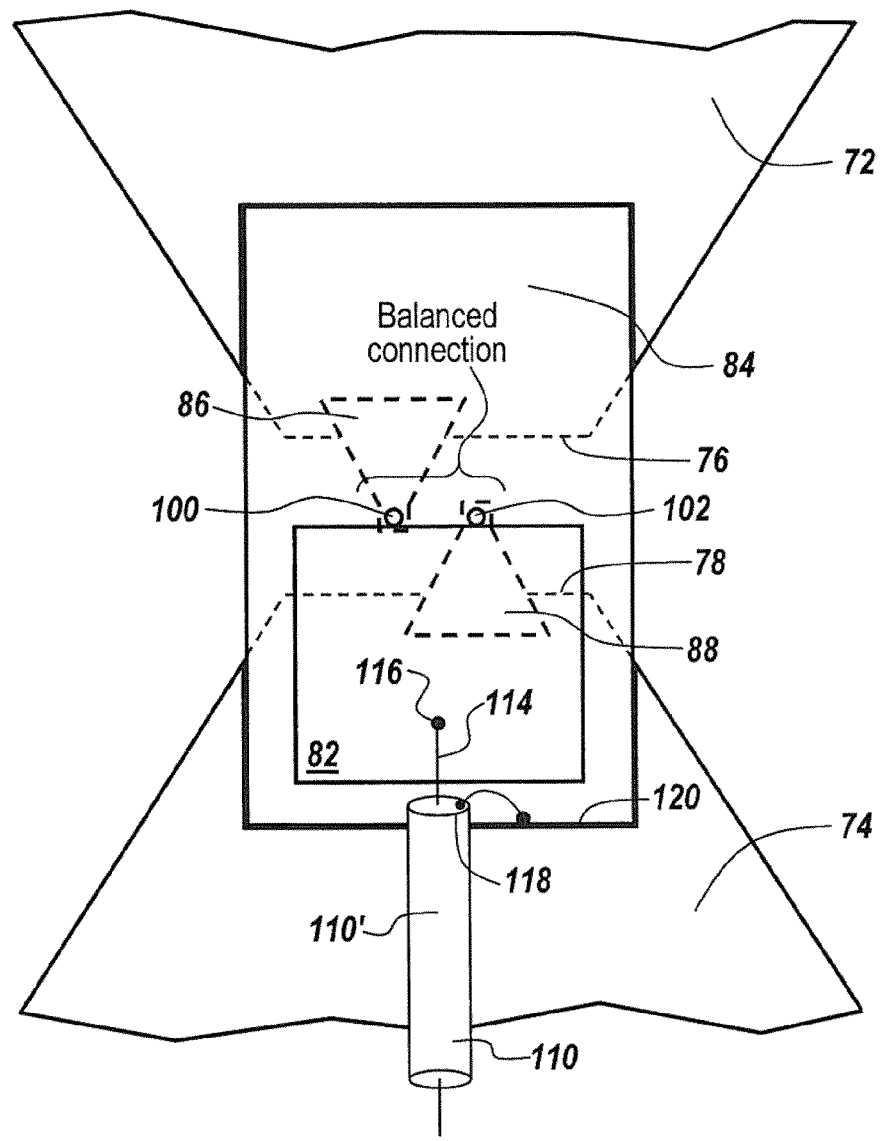
FIG. 11 is a diagrammatic illustration of the bi-cones and balanced circuit structure that feeds the bi-cones mounted on the substrate of FIG. 10 with the contact metallization for the bi-cones that provide the balanced connection to the bi-cones coupled to contact pads on a balanced output MMIC chip fed in the illustrated embodiment with an unbalanced coaxial line.

Referring now to FIG. 11, ceramic substrate 84 is shown at cone 72 and 74 apices 76 and 78 within the opposed notches of these apices.

Contact metallizations 86 and 88 are shown in dotted outline to have their particular apices 100 and 102 coupled to contact pads at the edge of micro-electronics 82 at which the balanced connection is available.

Here it can be seen that coax 110 is threaded through cone 74 as illustrated by dotted line 110' with it's center conductor 114 bonded to the MMIC chip 82 at 116. Likewise the outer braid 118 of coax 110 is bonded to either a grounding pad on the MMIC chip or to a surface 120 within the notch in bi-cone section 74.

It will be appreciated, that what is provided with the subject configuration and topology is that micro-electronics having a balanced connection are directly connectable to the balanced feed of the bi-cone antenna.

Thus, it will be seen that with the direct location of the micro-electronics at the feed point of the of a wideband antenna, whether it be a Vivaldi notch antenna, a bi-cone antenna, or other antenna that one can achieve a balanced connection at the natural balanced feed of the antenna, while at the same time eliminating the problems associated with removing of the electronics from the feed point of the antenna. Moreover, parasitic problems having to do with the apparatus associated with long distance feed of the antenna is eliminated with the finding that it is possible to massively alter the aperture of the antenna without effecting antenna characteristics.

What will be appreciated with the subject case is that the ability to direct feed balanced antenna feed points with a balanced feed directly at these feed points, aside from the benefits of eliminating a long feed line and the components thereof, is the smoothing of performance over frequency.

Figure 12:
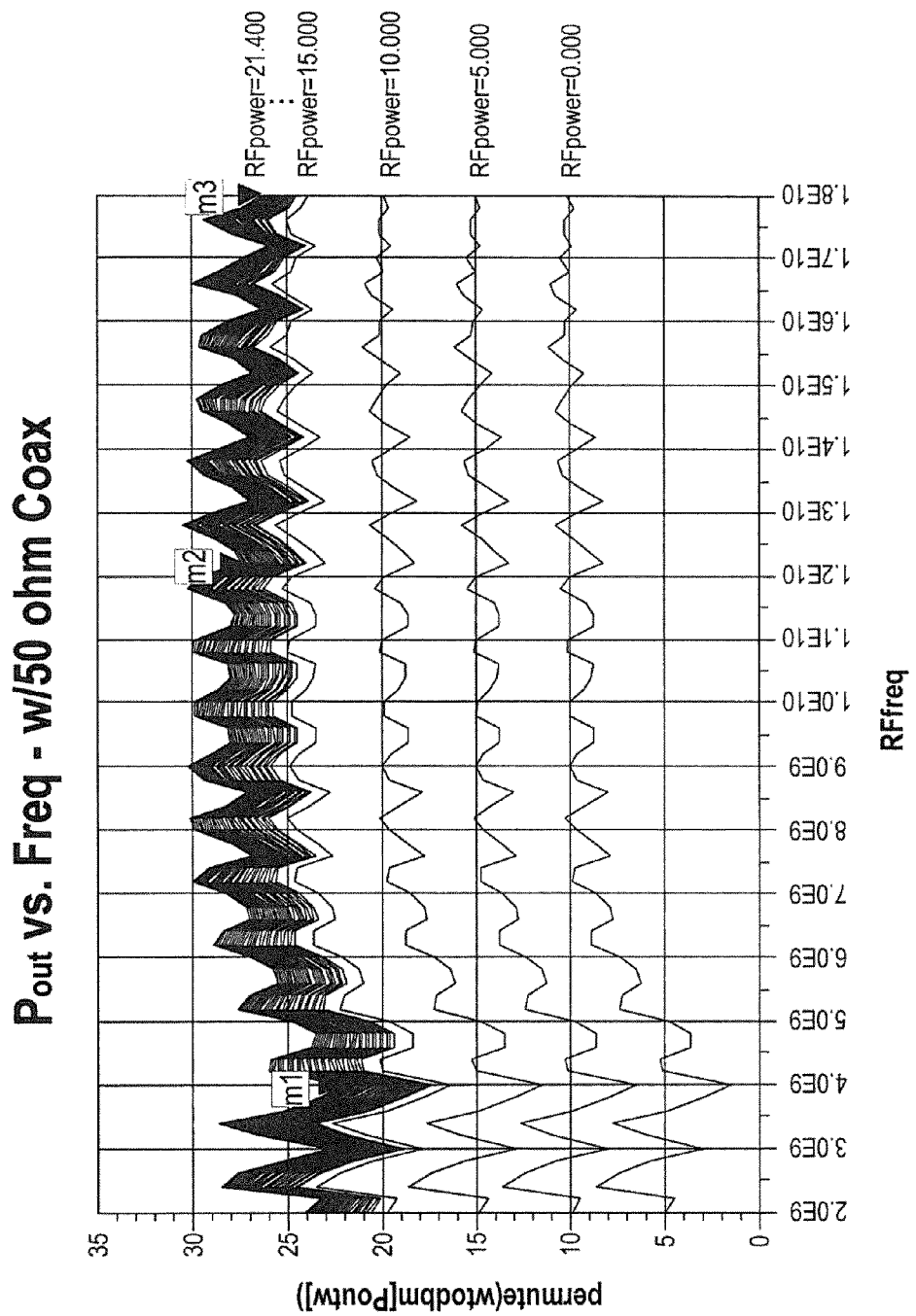
FIG. 12 is a graph of power output versus frequency for an electronic circuit for a 50 Ohm line between a conventional Vivaldi notch antenna and the remote electronics driving the antenna in terms of frequency versus power; and, FIG. 13 is a graph of power out versus frequency for a direct feed of the Vivaldi notch antenna of FIG. 12 with electronics which is not removed from the feed point of the antenna, showing a smoothing of the power output versus frequency.

This relates to the elimination of ripples and as can be seen in FIG. 12, to a relatively lengthy typical feed line between antenna and source. Ripples occur periodically with about a 3-5 DB amplitude due to reflections at both the antenna feed point and at the source of the energy for the antenna.

This ripple is problematic because it complicates the system operation including decreasing dynamic range. Note, that most systems have calibration look up tables and the formulation of the calibration look up tables, as well as the implementing of structures, are made more complicated with ripple. These undesirable artifacts or attributes are actually temperature dependent, and this makes the design of such structures and circuits even more difficult to realize.

Figure 13:
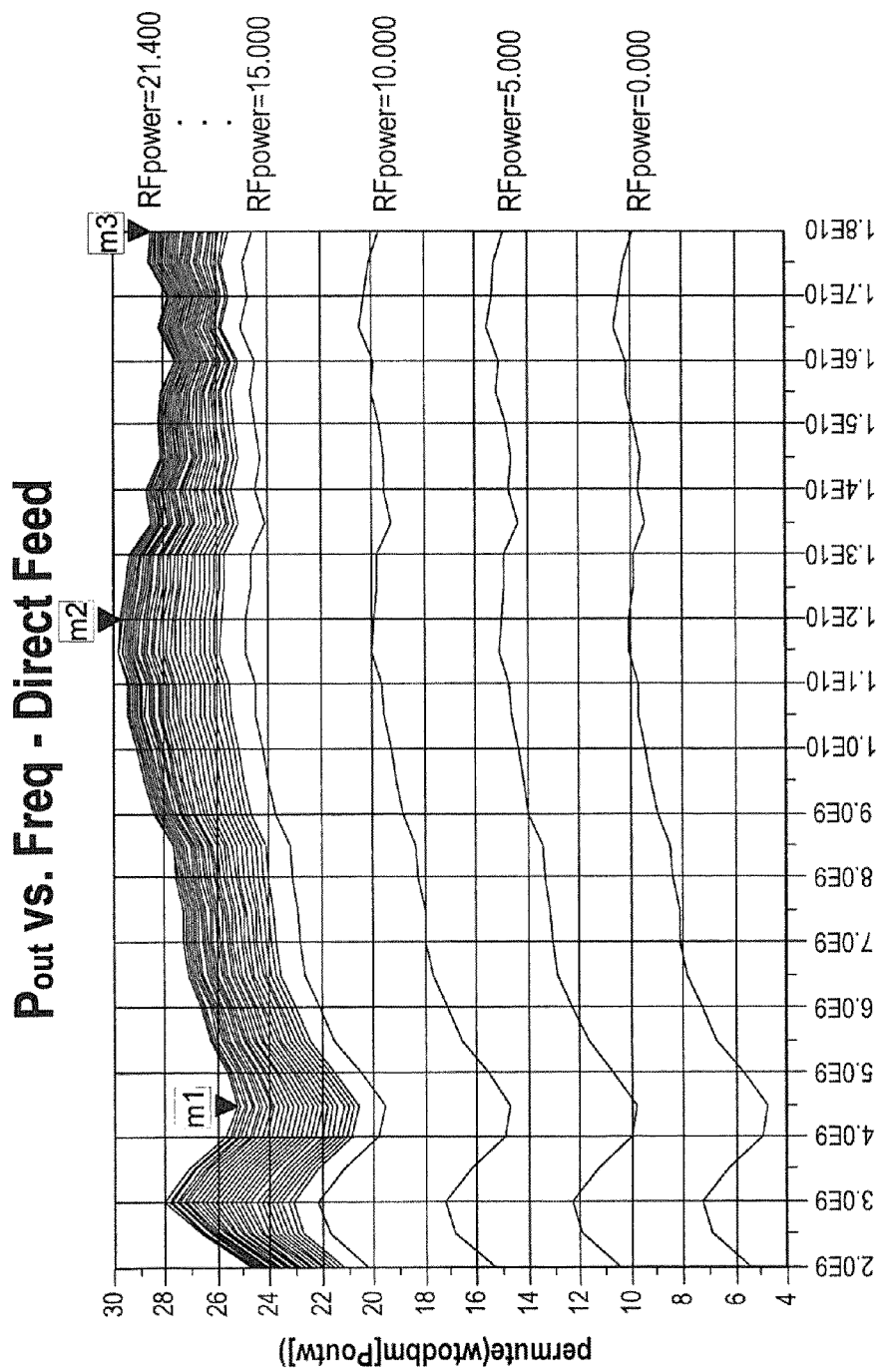

However, referring now to FIG. 13, rather than having the electronics removed from the feed of the antenna when the electronics are directly at the feed of the antenna, what can be seen is a significant smoothing of the power output versus frequency characteristic. Thus, the problems associated with the ripple have been virtually eliminated when providing the subject micro-electronic balanced circuit at the feed point of the antenna.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A system for minimizing parasitic and other losses due to the separation of antenna feed points from electronics connected thereto, comprising:
   an antenna having
      balanced feed points connected to an unbalanced feed line;
      an expanded lagoon;
      an electrically conductive support surface placed within the expanded lagoon;
      a monolithic microwave integrated circuit positioned within the expanded lagoon and supported by the electrically conductive support surface, wherein the support surface extends from the back of said lagoon forward towards the balanced feed points for supporting said integrated circuit at said feed points to enable direct connection therebetween, and the integrated circuit being connected across the balanced feed points of said antenna, said monolithic microwave integrated circuit having a balanced connection thereto; and,
   a direct connection from a pair of contact pads of said monolithic microwave integrated circuit to said balanced feed points by a pair of leads.

2. The system of claim 1, wherein said antenna is a broadband microwave antenna.

3. The system of claim 2, wherein said broadband microwave antenna includes a Vivaldi notch antenna.

4. The system of claim 1, wherein said monolithic microwave integrated circuit is fabricated using MMIC fabrication techniques and is of a size that fits within said lagoon.

5. The system of claim 3, wherein said Vivaldi notch antenna includes flutes extending from said lagoon and wherein said balanced 'feed points are at the juncture of said flutes and said lagoon.

* * * * *